(12) United States Patent
Bayram

(10) Patent No.: US 8,421,170 B2
(45) Date of Patent: Apr. 16, 2013

(54) METHOD FOR MICROFABRICATION OF A CAPACITIVE MICROMACHINED ULTRASONIC TRANSDUCER COMPRISING A DIAMOND MEMBRANE AND A TRANSDUCER THEREOF

(76) Inventor: Baris Bayram, Ankara (TR)

( * ) Notice: Subject to any disclaimer, the term of this patent is extended or adjusted under 35 U.S.C. 154(b) by 253 days.

(21) Appl. No.: 13/083,599

(22) Filed: Apr. 11, 2011

(65) Prior Publication Data

US 2012/0256517 A1 Oct. 11, 2012

(51) Int. Cl.
*H01L 29/84* (2006.01)
*H01L 29/82* (2006.01)
*H01L 31/08* (2006.01)
*H01L 21/77* (2006.01)

(52) U.S. Cl.
USPC .......................................................... 257/419

(58) Field of Classification Search .................. 257/415, 257/416, 419, E31.092, E29.324, E29.323, 257/E21.598; 438/50, 53
See application file for complete search history.

(56) References Cited

U.S. PATENT DOCUMENTS

| | | | | |
|---|---|---|---|---|
| 8,018,301 B2* | 9/2011 | Huang | ........................... | 333/186 |
| 2005/0228285 A1* | 10/2005 | Huang et al. | .................. | 600/459 |
| 2008/0290756 A1* | 11/2008 | Huang | ........................... | 310/300 |
| 2009/0140357 A1* | 6/2009 | Kupnik et al. | ................ | 257/416 |
| 2010/0013574 A1* | 1/2010 | Huang | ........................... | 333/186 |
| 2011/0050033 A1* | 3/2011 | Nikoozadeh et al. | .......... | 310/300 |

* cited by examiner

*Primary Examiner* — Victor A Mandala

(57) ABSTRACT

This invention relates generally to capacitive micromachined ultrasonic transducers (CMUTs), particularly to those comprising diamond or diamond like carbon membranes and a method of microfabrication of such CMUTs, wherein the membrane of diamond or diamond like carbon is attached to the substrate by plasma-activated direct bonding of an interlayer of high temperature oxide (HTO).

30 Claims, 18 Drawing Sheets (e)

(f)

(g)

(c)

(d)

- Silicon substrate
- Doped silicon substrate
- Thermal grown silicon dioxide
- High temperature silicon dioxide
- Diamond
- Plasma enhanced chemical vapor deposition (PECVD) silicon dioxide (a)

(b)

(a)

(b)

(a)

(b)

(c)

METHOD FOR MICROFABRICATION OF A CAPACITIVE MICROMACHINED ULTRASONIC TRANSDUCER COMPRISING A DIAMOND MEMBRANE AND A TRANSDUCER THEREOF

FIELD OF THE INVENTION

This invention relates generally to capacitive micromachined ultrasonic transducers (CMUTs), particularly to those comprising diamond or diamond like carbon (will be referred to as diamond) membranes and a method of microfabrication of such CMUTs.

BACKGROUND OF THE INVENTION

Capacitive micromachined ultrasonic transducers (CMUTs) are electromechanical energy conversion devices used to transmit and receive ultrasound. CMUTs used in immersion are generally composed of vacuum-sealed cavities formed by a membrane material. The vacuum-sealed cavities are conventionally realized by two techniques. First one is the sacrificial release process where sacrificial material deposited before the membrane material is etched through the etch holes, and etch holes are filled by deposition under low pressure to form the cavity. CMUTs fabricated by sacrificial release process mostly feature $Si_3N_4$ membranes. The limitations of sacrificial release process to achieve very large membranes without breaking or very small membranes with high fill factor adversely affect the precise engineering of the transducer physical parameters. The $Si_3N_4$ membranes are also hard to present well-controlled deflection profiles due to the process-dependent residual stress in the membrane material. The second one is direct wafer bonding method where two wafers (one having cavity patterning and the other having the membrane material) are bonded under elevated temperatures under vacuum.

Among these microfabrication methods, direct wafer bonding technology is more economical offering better process control, higher yield, and more novelties in CMUT designs than the sacrificial release process. Direct wafer bonding technology enabled development of single crystal silicon membrane CMUTs rather than silicon nitride membrane ones. As the membrane and the substrate material are both silicon, direct wafer bonding at high temperatures (1100° C.) is achieved without introducing any residual stress in the membrane. Furthermore, IC compatible direct wafer bonding at lower temperatures (400° C.) can be also utilized. This technology has significantly reduced the complexity and the time of the processing of CMUTs additionally offering superior process control, high yield, and improved uniformity compared to the already mature sacrificial release process. Best part of wafer bonding technology is to present a well-known silicon crystal material as a membrane, and to achieve vacuum sealed cavities without the need to open etch holes on the membrane, both of which directly translate into reliable operation in immersion. Recently, successful flip-chip bonding of IC and wafer-bonded 2-D CMUT arrays incorporating through wafer trench-isolated interconnects has been demonstrated. Therefore, recent developments enable the specifications of the CMUT design be comfortably satisfied facilitating the realization of industrial grade CMUT products using direct wafer bonding technology.

Energy conversion efficiency of CMUTs has been of primary importance for ultrasound applications, and improvement of this efficiency has been extensively studied for ultrasound transducers. Conventionally, the CMUT is biased at a voltage below the collapse voltage, and an AC signal is applied to generate ultrasound. The efficiency of the transducer is drastically improved as the bias voltage approaches the close vicinity of the collapse voltage. However, this high efficiency comes with a risk of membrane collapse onto the substrate. Additionally, the AC amplitude is limited to a small excitation voltage around a large bias voltage to prevent membrane collapse during operation. Therefore, the maximum output pressure of a CMUT is inherently limited by the requirements of the conventional operation.

For potential applications such as high intensity focused ultrasound (HIFU) in medical therapeutics, larger output pressures are essential. To offer unprecedented acoustic output pressure in transmit without the aforementioned limitations, novel CMUT operation modes of collapse and collapse-snapback are introduced. Both operation modes require the membrane to contact the substrate surface, which poses a problem on the durability of the membrane in terms of structural integrity and tribological property. Large membrane deflection at collapse increases the stress within the membrane, and change of stress at ultrasound frequencies causes reduced lifetime and compromised reliability in these high output pressure operation modes. Ultrasound applications require the transducer surface to be in contact with the acoustic medium. Because the surface is subject to environmental conditions as well as external pressures, the durability of the membrane defined by hardness is also a major criteria for CMUT performance. Because of electrostatic forces in addition to the atmospheric pressure due to the vacuum sealed cavities, Young's modulus of the membrane plays an important role in the membrane deflection profiles as well.

Collapse-snapback mode requires the collision of the contacting surfaces every cycle, and heat released needs to be dissipated quickly to maintain stable operation. Based on the additional requirements of these modes to reach high output transmit pressure at a sustainable transducer operation, diamond is proposed as the ultimate solution to be used as the membrane material. Mechanical (high Young's modulus, extreme hardness), thermal (large thermal conductivity, low thermal expansion coefficient), and electrical properties (insulator, large electrical breakdown field) of diamond are all in favor of its use in the microfabrication of CMUTs. Chemical inertness, biocompatibility and surface modification are further benefits of diamond for CMUTs to be utilized in corrosive environment and biological samples, respectively. For example, hydrophilic $O_2$-terminated diamond surface, achieved by oxygen plasma or piranha wet processing, will withstand against the detrimental cavitation shock of bubbles in immersion. Because no wet chemical etchant of diamond exists, its use is best suited for extreme and harsh environments. Compared to all potential membrane materials as well as current membrane materials of $Si_3N_4$ and silicon, diamond distinguishes itself based on high Young's modulus and exceptional hardness (see Table 1 for material properties of $Si_3N_4$, Si, and diamond).

TABLE 1

| Property | Material | | |
| --- | --- | --- | --- |
| | Silicon Nitride | Silicon | Diamond |
| Young's Modulus (GPa) | 320 | 160 | 1200 |
| Hardness (kg/mm$^2$) | 1580 | 1000 | 10000 |
| Thermal Conductivity (W/mK) | 30 | 151 | 2000 |
| Thermal Expansion ($10^{-6}$/K) | 3.3 | 2.5 | 1.1 |

Diamond is a perfect membrane material candidate based on its material properties. However, unmature single crystal diamond (SCD) deposition technologies prevented diamond membranes integration into CMUTs. Thin film SCD coated wafers are not commercially available for batch MEMS processes. Surface roughness of SCD is also high to be utilized for CMUT microfabrication based on direct wafer bonding technology.

Recently, with improvements in diamond material growth and technology, ultrananocrystalline diamond (UNCD) as a thin film was made commercially available.

UNCD shares a large portion of the benefits of the SCD with compromised features such as reduced resistivity due to graphitic forms enclosing polycrystalline diamond (SCD: insulator, UNCD: highly resistive). A remarkable feature of UNCD as a membrane material is its deposition as a thin film over a wafer surface with very low residual stress (i.e. <50 MPa). UNCD, featuring smaller grain size and surface roughness has been recently explored for microelectromechanical systems (MEMS) applications such as RF MEMS resonators and hybrid piezoelectric/UNCD cantilevers. However, there are no studies of CMUTs with diamond membranes.

In the documents U.S. Pat. No. 7,846,102B2 and U.S. Pat. No. 7,745,248B2 disclosing various improvements regarding CMUTs, it has been merely mentioned that diamond can be used in the membrane material amongst other materials such as silicon, silicon nitride or silicon carbide.

In the document U.S. Pat. No. 7,530,952B2, a CMUT incorporating direct wafer bonding between the membrane and the substrate is disclosed. It has also been mention in said document that the membrane material can be of diamond amongst other materials such as silicon, silicon nitride or sapphire.

The inventions disclosed in the above mentioned documents, U.S. Pat. No. 7,846,102B2, U.S. Pat. No. 7,745,248B2 and U.S. Pat. No. 7,530,952B2, are not concerned with providing a method to use diamond in the membrane and thus, neither the characteristics of the diamond material to be used nor the means for such use of diamond are not established.

An inconvenience arises in the use of diamond in a membrane to be joined to the substrate by direct wafer bonding, due to the surface properties of diamond layers grown on a substrate as is required for direct wafer bonding. The high surface roughness of such a diamond layer and the low chemical affinity between diamond and silicon dioxide hinders the establishment of the desired direct wafer bond. Moreover, applying conventional polishing methods on a diamond layer does not improve the direct wafer bonding abilities of the diamond layer.

SUMMARY OF THE INVENTION

The object of the invention is to achieve microfabrication of a CMUT employing a membrane having ultrananocrystalline diamond (UNCD) or nanocrystalline diamond (NCD). A membrane made of diamond advances the state of the art CMUT features due to several advantageous diamond material properties such as high Young's modulus, high hardness, high heat conductivity and low thermal expansion.

Another object of the invention is to achieve microfabrication of a diamond-based CMUT by plasma-activated direct wafer bonding of cavity-defined thermally oxidized silicon wafer and diamond coated silicon wafer having a thin high temperature oxide interlayer on top.

The method for microfabrication of a diamond-based CMUT having at least one CMUT cell, basically includes the steps
1. preparation of the base substrate by
   a. preparing a first electrode layer on a substrate, preferably by doping of the surface of said substrate and forming a conductive top surface suitable for ohmic contact with a metal;
   b. and forming cavity walls on said doped substrate surface by growing, patterning via lithography mask, and then etching silicon dioxide;
2. preparation of the membrane substrate by
   a. preparing or obtaining of diamond layer coated on a substrate;
   b. depositing electrically-insulating high temperature oxide on diamond as an intermediate layer.
   c. and thinning the intermediate layer to a final thickness via chemical mechanical polishing (CMP) to achieve reduced surface roughness of the top interlayer surface for direct wafer bonding;
3. bonding of the base and the membrane substrates by
   a. cleaning and plasma activation of both surfaces of the base and the membrane substrates;
   b. contacting of both surfaces in high vacuum conditions ($10^{-4}$ mbar) such that the intermediate layer is facing cavities;
   c. annealing the pre-bonded substrates under 10 kN contacting force at 550° C. for several hours;
4. removing the substrate of the diamond layer;
5. and forming at least one second electrode on the membrane and at least one first electrode connection;

wherein the intermediate layer of step 2.b. is of a material with high chemical affinity towards the cavity wall material and by polishing the surface roughness of said intermediate layer is decreased after deposition, to below 0.5 nm thus providing a surface suitable for direct wafer bonding. The resulting thickness of said intermediate layer after being polished is determined such that the behavior of the membrane is determined by the diamond layer.

Preferably, for the diamond layer, diamond in the form of a nanocrystalline diamond (NCD) or an ultrananocrystalline diamond (UNCD) layer with a low residual stress below 50 MPa is obtained on a silicon or silicon dioxide wafer and then a high temperature oxide (HTO) to form the intermediate layer is applied on the diamond layer. The HTO is then chemically-mechanically polished (CMP) to obtain the desired surface roughness and thickness. Shaping of various layers can be performed using known masking, etching etc. methods.

Thus the CMUT according to the invention consists of a base wafer, a conductive layer to act as a first electrode on one surface of said base wafer, at least one cavity on said first electrode, an intermediate layer adjacent to said at least one cavity, a diamond membrane, at least one second electrode on the membrane and at least one first electrode connection.

The diamond layer may be undoped or doped. If the diamond used for the membrane is of a conductive form, then the membrane itself acts as a second electrode. Then, the intermediate layer serves also as an electrical insulator preventing the circuit from shorting through the first electrode.

BRIEF DESCRIPTION OF THE FIGURES

The objectives and advantages of the present invention will be understood by reading the following detailed description in conjuction with the drawing, in which.

DETAILED DESCRIPTION OF PREFERRED EMBODIMENTS

Although the following detailed description contains many specifics for the purposes of illustration, anyone of ordinary skill in the art will readily appreciate that many variations and alterations to the following exemplary details are within the scope of the invention.

Accordingly, the following preferred embodiment of the invention is set forth without any loss of generality to, and without imposing limitations upon, the claimed invention.

Figure 1:
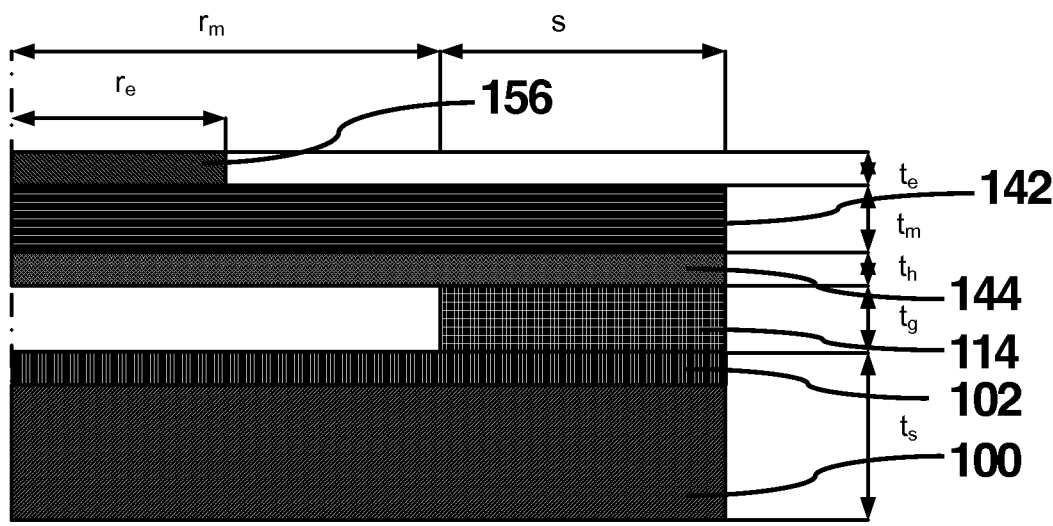
FIG. 1 is a planar cross-section view of the CMUT cell according to the invention.

A CMUT cell produced according to the present invention is shown in FIG. 1. Said CMUT cell consists of a silicon substrate base wafer 100, a substrate electrode layer 102 produced on one surface of said substrate base wafer 100 by doping said surface, cavity walls 114 of a thermal oxide on said substrate electrode layer 102 for defining at least one cavity, a diamond layer 142 to provide membrane functions, an intermediate layer 144 of HTO deposited on one side of said diamond layer 142 and providing a surface for direct wafer bonding between said cavity walls 114 and said diamond layer 142, a membrane electrode 156 on the other side of the diamond layer 142, and substrate electrode connections 158 (not shown in FIG. 1) formed on the substrate electrode layer 102. The diamond layer 142 may be undoped or doped. When the diamond layer 142 is doped, the diamond layer 142 itself acts as an electrode and the membrane electrode 156 is rendered obsolete thus it is either used merely as an electrode connection or is not fabricated at all.

The substrate electrode layer 102 can be n-doped or p-doped, using dopants such as phosphorus or boron respectively.

NCD consists of nanocrytalline diamond each of which having a grain size of 10 nm, whereas UNCD consists of ultrananocrystalline diamond each of which having a grain size of 3 to 5 nm.

During CMP, a reduction of 0.3 µm is sufficient to decrease the surface roughness of the intermediate layer 124 of HTO in FIG. 5(c) to a value below 0.5 nm. Thus the originally deposited HTO 122 in FIG. 5(b) has a thickness 0.3 µm more than the desired thickness.

Figure 8:
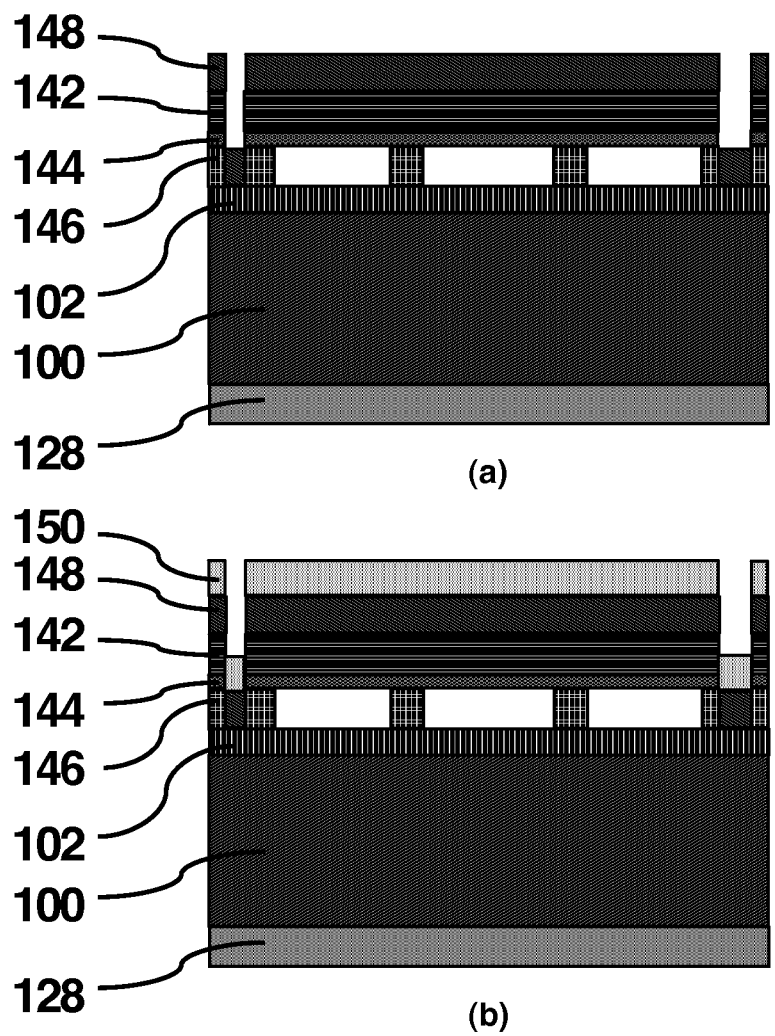
FIG. 8(a) shows aluminium deposited on top surface of FIG. 7(f).
FIG. 8(b) shows spray-coated photoresist layer on top surface of FIG. 8(a).
FIG. 8(c) shows patterned photoresist layer of FIG. 8(b) via lithography mask METAL.
FIG. 8(d) shows planar cross-sectional view of the final device having patterned aluminium layer (protected via patterned photoresist) via wet chemical etching, and removal of the patterned photoresist via oxygen plasma.
Figure 8:
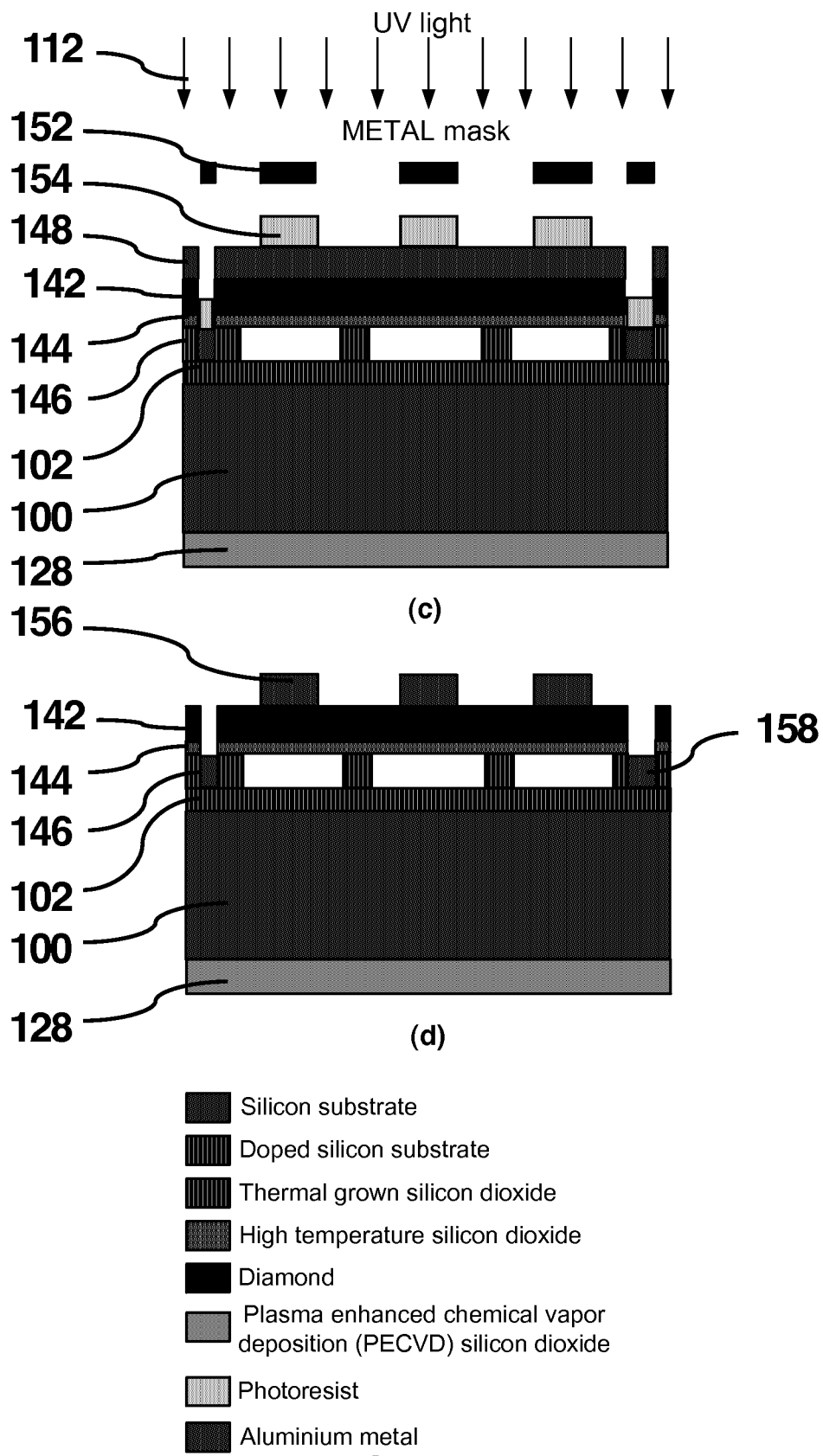

The membrane electrode 156 and the substrate electrode connections 158 in FIG. 8(d) can be of any combination of metals such as aluminum, titanium, platinum or gold.

The dimensions of the CMUT cell is determined according to the operational characteristics of the ultrasound transducer such as collapse voltage and center frequency.

The ratio of the thickness of the intermediate layer 144 to that of the diamond layer 142 cannot exceed 5 such that the behavior of the membrane is determined by the diamond layer 142. Said ratio is preferably 0.25.

Some dimensions have been marked on the CMUT cell depicted in FIG. 1 where; $t_s$ is the substrate base wafer 100 thickness including the substrate electrode layer 102, $t_g$ is the thickness of the cavity walls 114 and thus the cavities, $t_h$ is the thickness of the intermediate layer 144, $t_m$ is the thickness of the diamond layer 142, $t_e$ is the thickness of the membrane electrode 156, s is the support length of a CMUT cell excluding the substrate electrode connections 158, $r_m$ is the radius of a cavity and thus the active region of the membrane, and $r_e$ is the radius of the membrane electrode 156.

Figure 2:
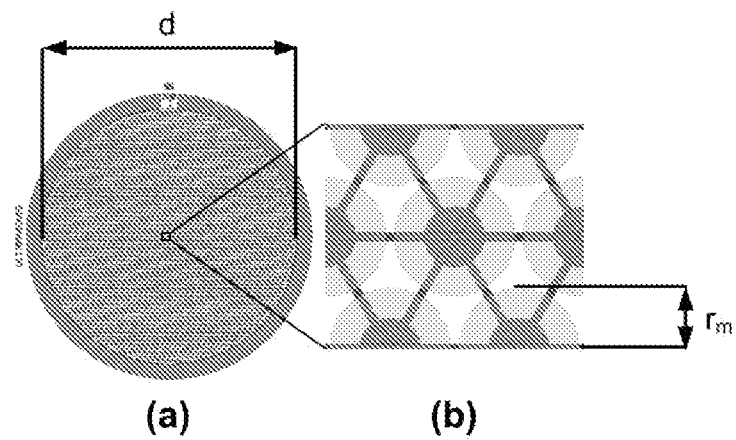
FIG. 2(a) shows a top view of a single CMUT.
FIG. 2(b) shows a magnified view of a CMUT cell and its neighboring cells.
Figure 3:
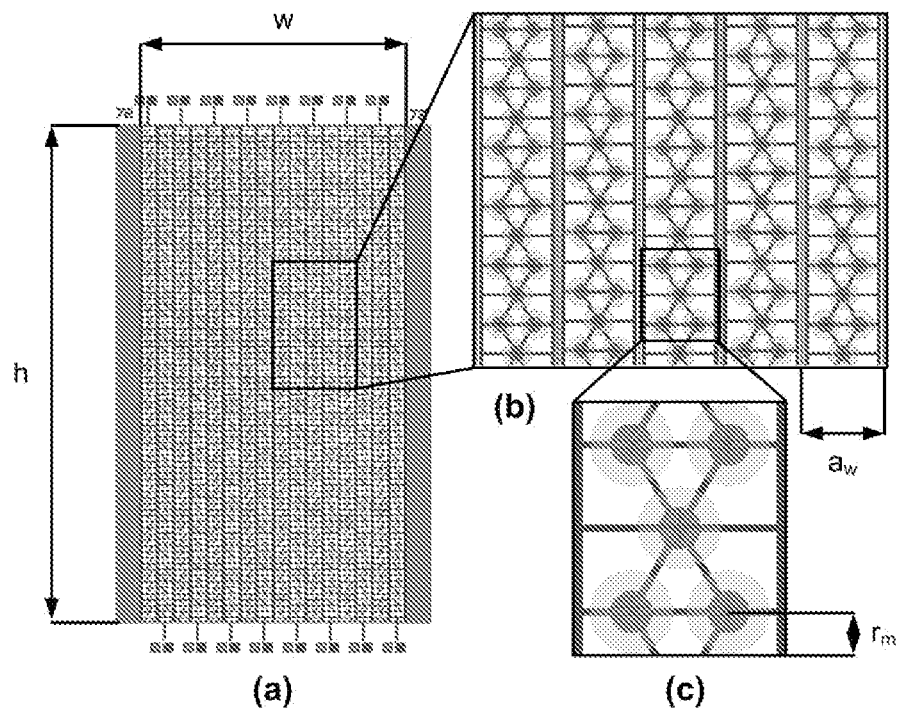
FIG. 3(a) shows a top view of a 16-element 1-D CMUT array.
FIG. 3(b) shows a magnified view of a portion of 5 neighboring 1-D CMUT array elements.
FIG. 3(c) shows a magnified view of a CMUT cell and its neighboring cells.

For a CMUT cell according to the invention the above defined dimensions are $t_s$: approximately 500 µm, insignificant in scope of the invention
$t_g$: 0.1-5 µm, as is known from the prior art
$t_h$: 0.1-1 µm
$t_m$: 0.3-10 µm
$t_e$: 0.2-2 µm, as is known from the prior art
s: 1-100 µm, as is known from the prior art
$r_m$: 5-1000 µm, as is known from the prior art
$r_e$: 5-1000 µm, as is known from the prior art A CMUT producing ultrasound vibrations of a frequency of 1.74 MHz in air under a DC voltage of 100 V, fabricated according to the invention was used for testing purposes. The dimensions of each CMUT cell accordingly are $t_s$: 525 µm
$t_g$: 1.57 µm
$t_h$: 0.23 µm
$t_m$: 1.0 µm
$t_e$: 0.4 µm
s: 3 µm
$r_m$: 60 µm
$r_e$: 30 µm A single CMUT design in FIG. 2 and 1-D CMUT array design in FIG. 3 are realized successfully using the present invention.

Figure 4:
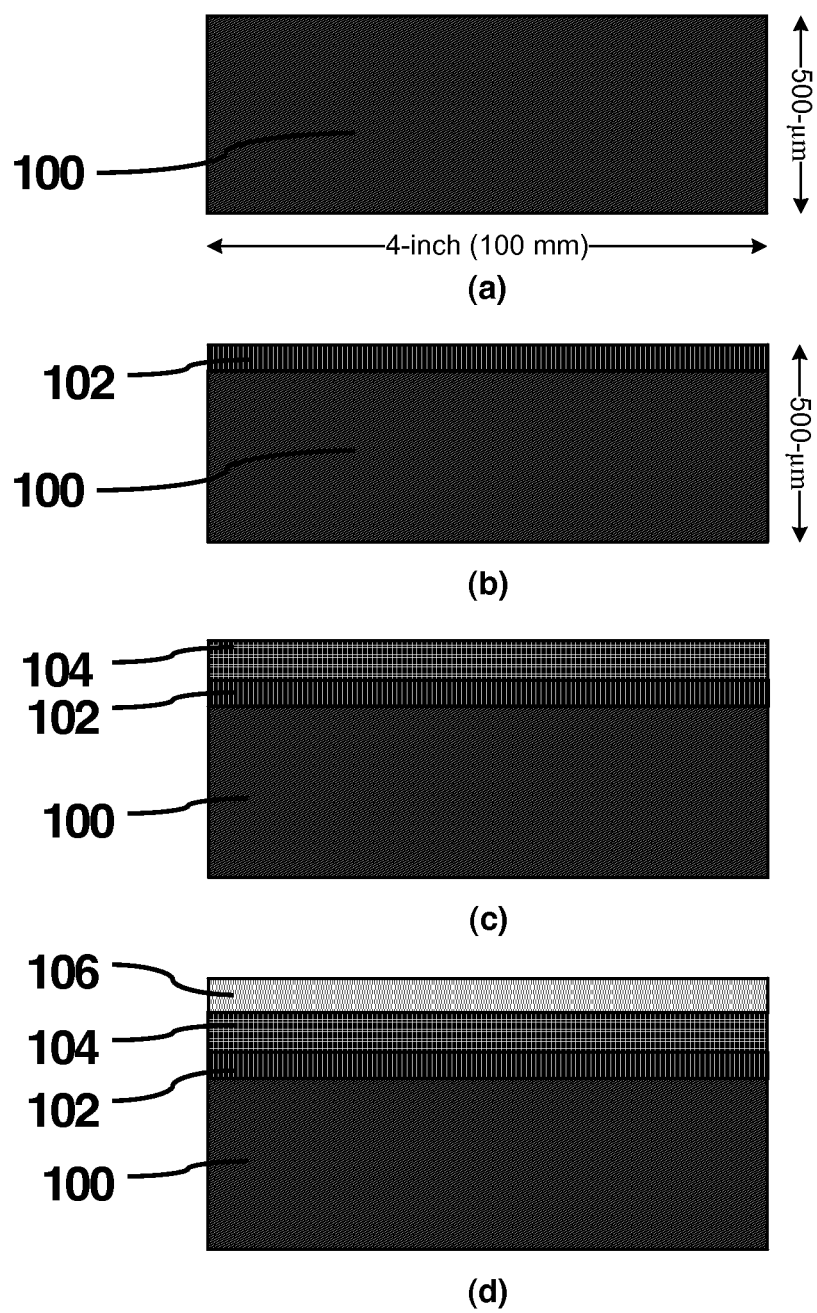
FIG. 4(a) shows an n-type silicon substrate with <100> crystal orientation.
FIG. 4(b) shows an n-type silicon substrate with phosphorous doped ($n^+$-type) conductive surface layer.
FIG. 4(c) shows thermally oxidized silicon dioxide layer on top of $n^+$-type surface layer.
FIG. 4(d) shows spin-coated photoresist layer on top of thermal silicon dioxide layer of FIG. 4(c).
FIG. 4(e) shows patterned photoresist layer of FIG. 4(d) via lithography mask CAVITY.
FIG. 4(f) shows patterned thermal silicon dioxide layer (protected via patterned photoresist) via reactive ion etching of silicon dioxide ($RIE-SiO_2$) using $CHF_3/CF_4$ gas chemistry.
FIG. 4(g) shows cavity walls of thermal silicon dioxide formed over doped silicon substrate (photoresist removed via oxygen plasma).
Figure 4:
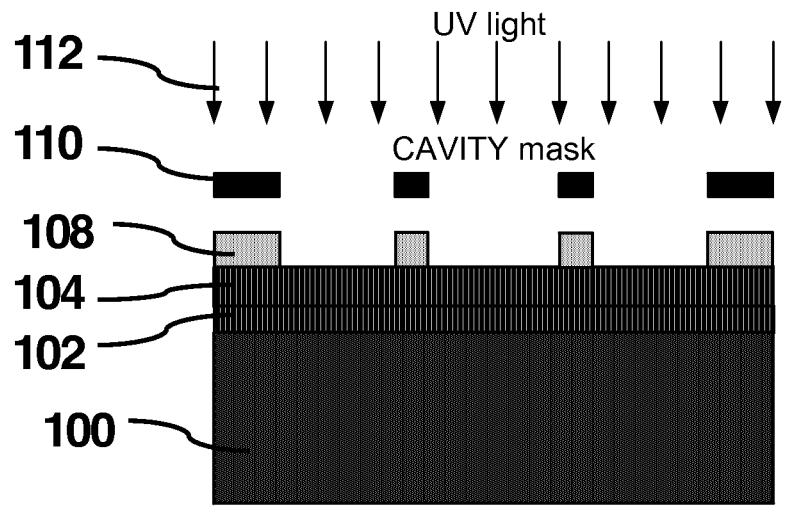
Figure 4:
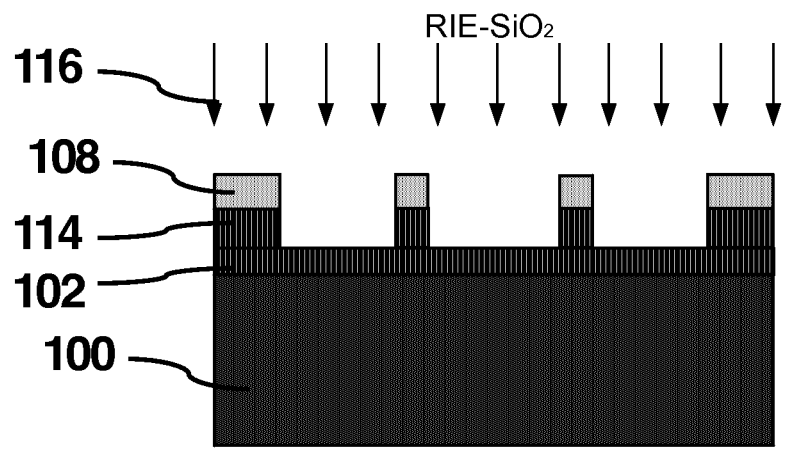
Figure 4:
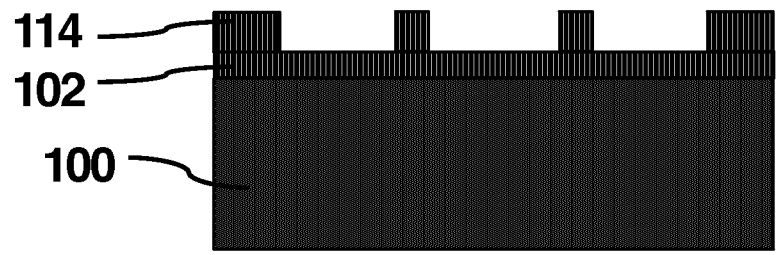
Figure 4:
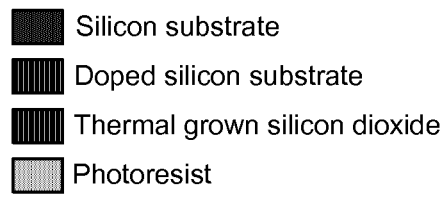
Figure 5:
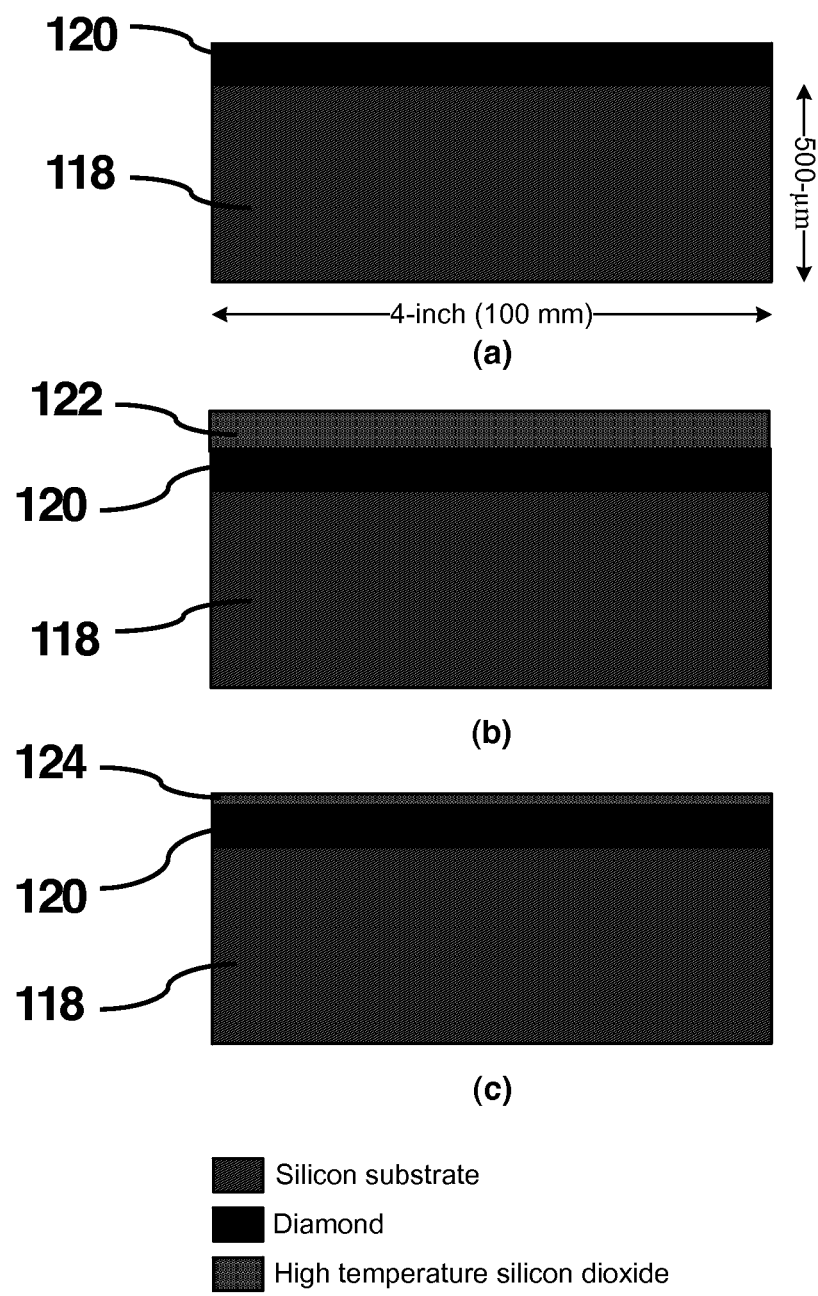
FIG. 5(a) shows diamond deposited on silicon wafer.
FIG. 5(b) shows high temperature oxide ($SiO_2$) deposited on silicon substrate in a low pressure chemical vapor deposition (LPCVD) furnace using dichlorosilane ($SiH_2Cl_2$) and nitrous oxide ($N_2O$) gas chemistry.
FIG. 5(c) shows chemically mechanically polished (CMP) high temperature oxide layer (thinned) of FIG. 5(b).
Figure 6:
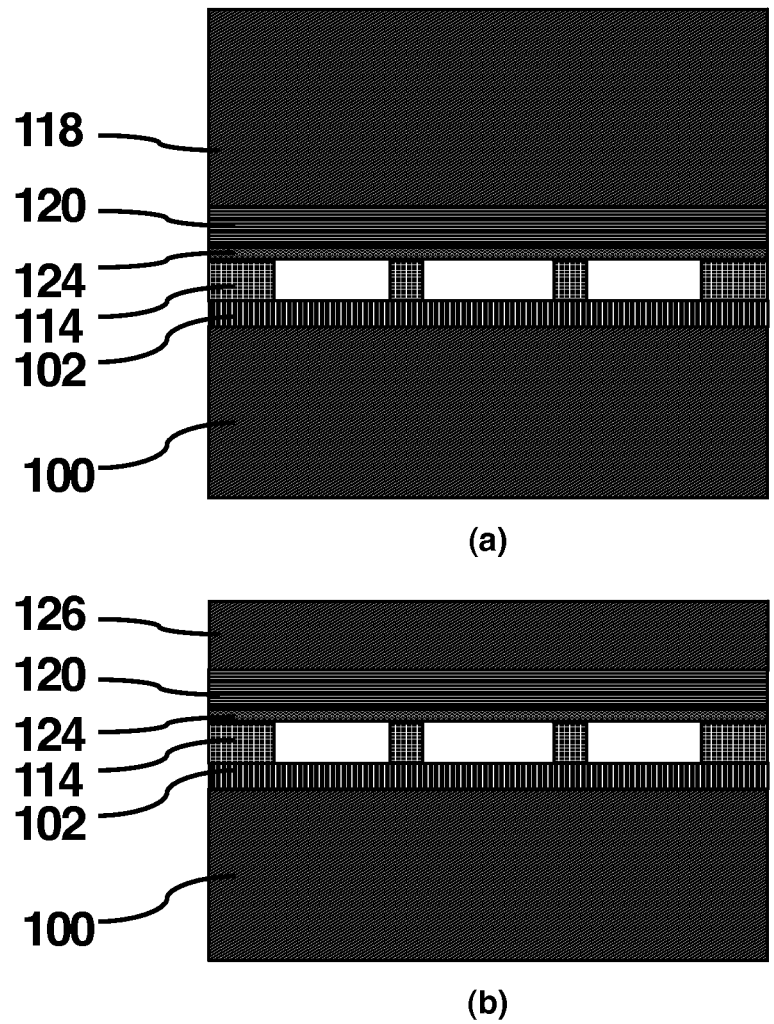
FIG. 6(a) shows plasma-activated direct wafer bonded pair of top surfaces of substrates in FIG. 4(g) and FIG. 5(c).
FIG. 6(b) shows thinned substrate (mechanically supporting the diamond layer) of FIG. 6(a) via grinding.
FIG. 6(c) shows plasma enhanced chemical vapor deposition (PECVD) of silicon dioxide on the bottom of the substrate having cavity walls.
FIG. 6(d) shows diamond membranes over cavity via wet chemically etched thinned substrate of FIG. 6(b).
Figure 6:
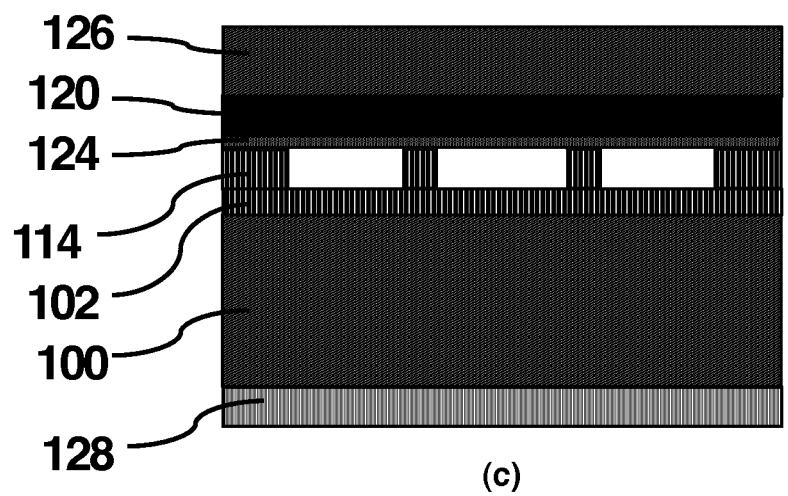
Figure 6:
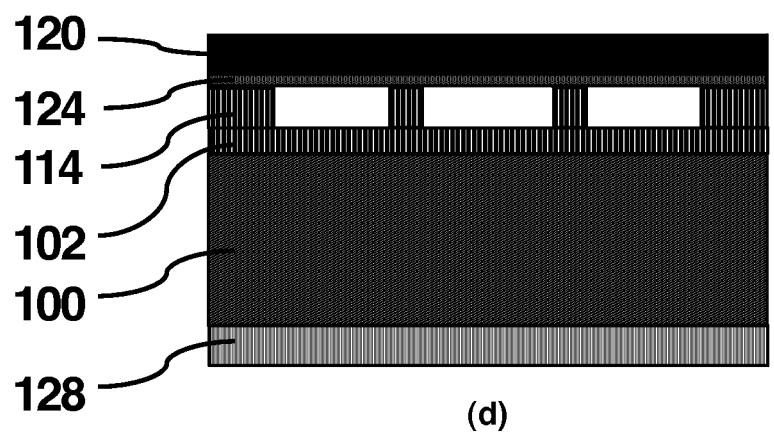
Figure 6:
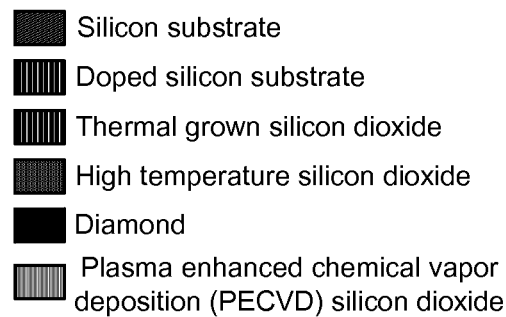
Figure 7:
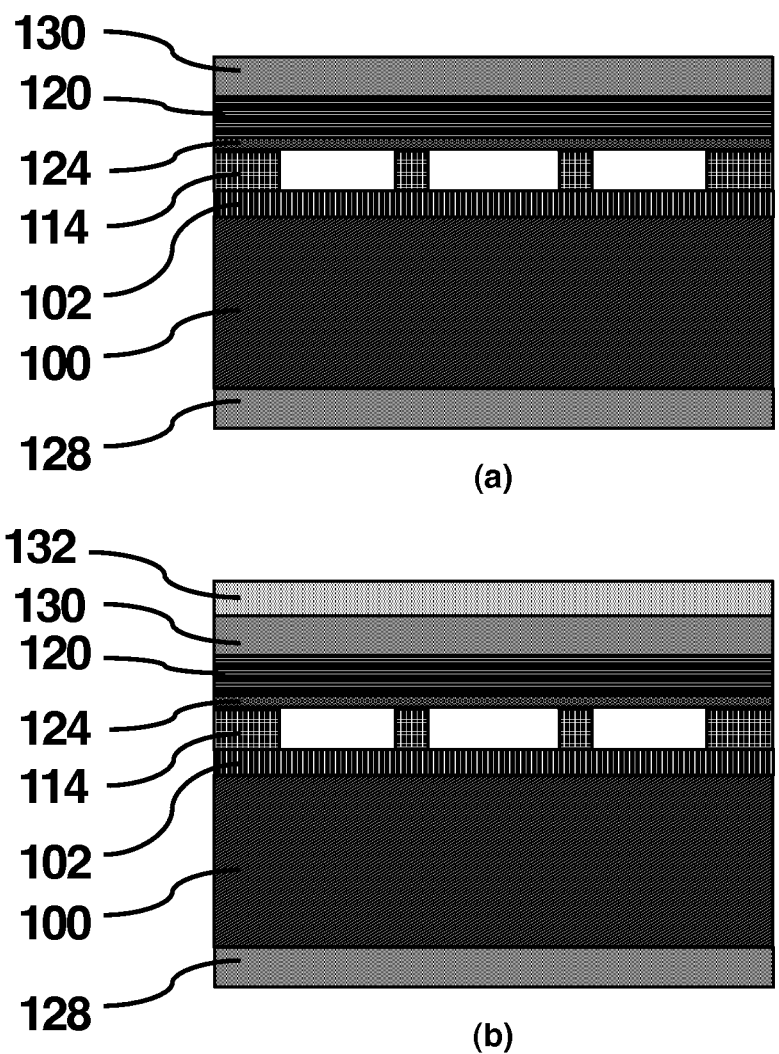
FIG. 7(a) shows plasma enhanced chemical vapor deposition (PECVD) of silicon dioxide on top of the diamond membrane of FIG. 6(d).
FIG. 7(b) shows spray-coated photoresist layer on top of PECVD silicon dioxide of FIG. 7(a).
FIG. 7(c) shows patterned photoresist layer of FIG. 7(b) via lithography mask CONTACT.
FIG. 7(d) shows patterned PECVD silicon dioxide layer (protected via patterned photoresist) via reactive ion etching of silicon dioxide ($RIE-SiO_2$) using $CHF_3/CF_4$ gas chemistry.
FIG. 7(e) shows patterned diamond layer (protected via patterned PECVD silicon dioxide layer) via reactive ion etching of diamond (RIE-C) using inductively coupled $O_2$ plasma.
FIG. 7(f) shows opening of ground contact area on doped substrate and top electrode contact area on diamond membrane via reactive ion etching of silicon dioxide ($RIE-SiO_2$) using $CHF_3/CF_4$ gas chemistry.
Figure 7:
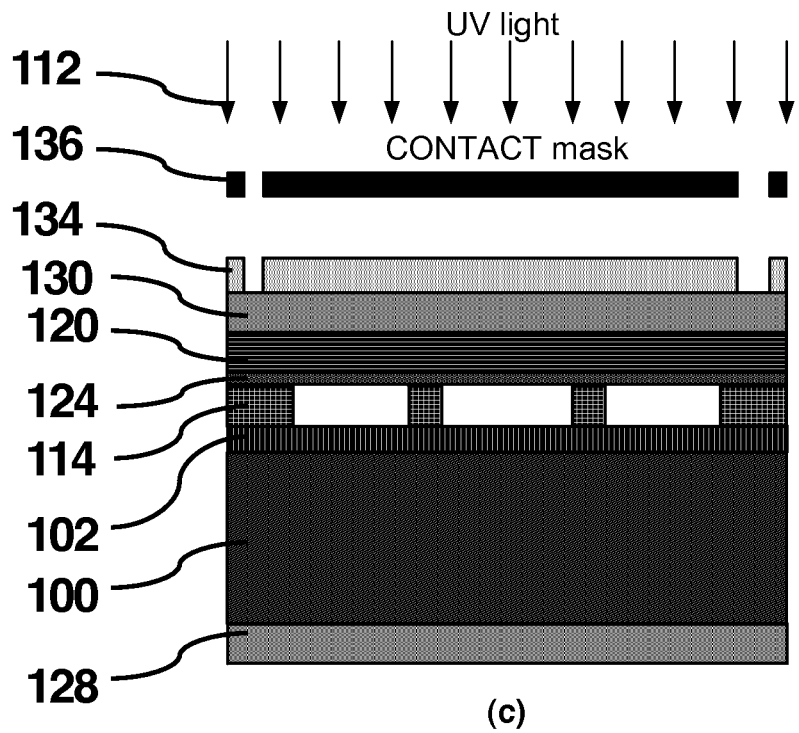
Figure 7:
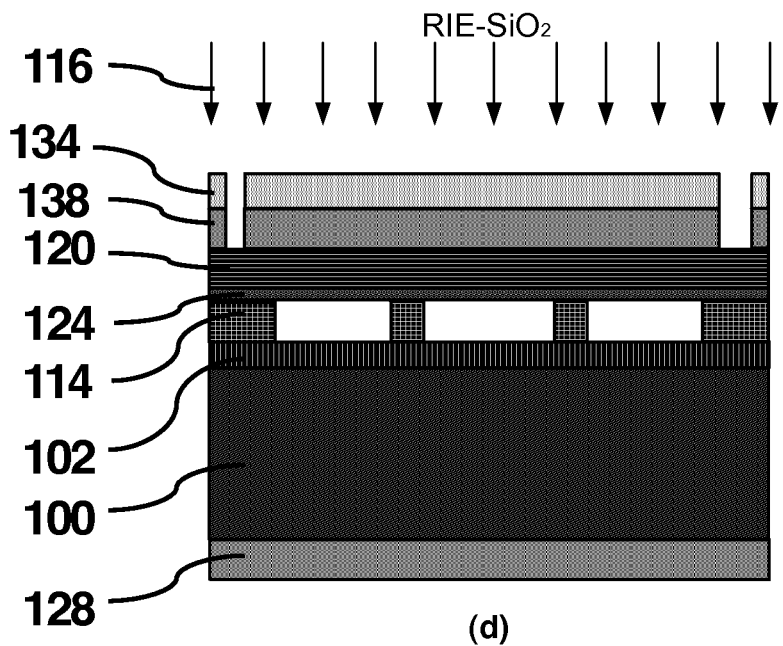
Figure 7:
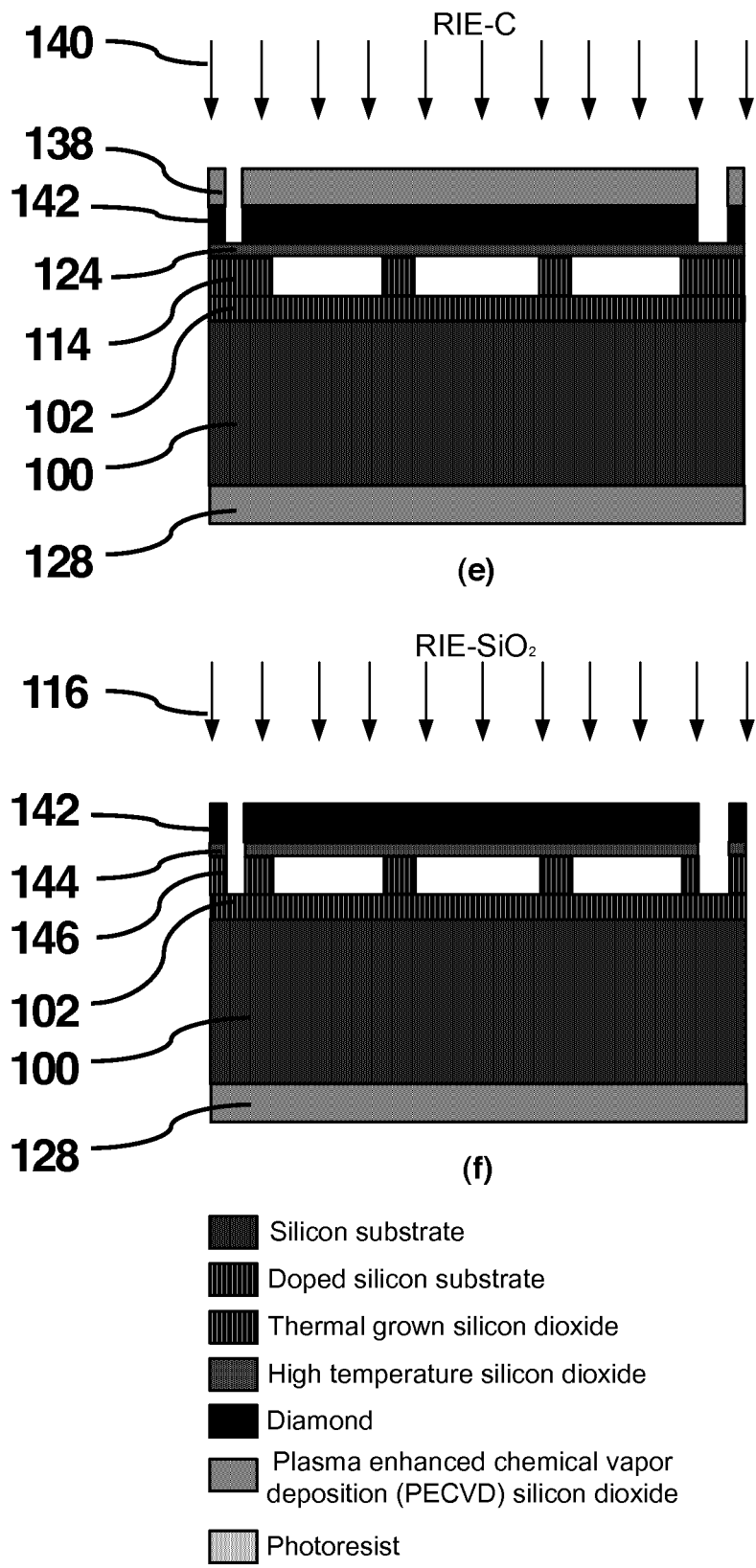

For the above mentioned CMUT, the method for microfabrication of a CMUT comprising a diamond membrane was performed through the steps:

1. preparation of the substrate by
   a. preparing an n-type silicon wafer as a substrate base wafer 100 of 500 µm to act as a base for the CMUT as depicted in FIG. 4(a);
   b. doping the surface of the substrate base wafer 100 with phosphorous, by processing in a doping furnace with POCl$_3$ and O$_2$ at 1050° C., to obtain a conductive substrate electrode layer 102, with a conductivity less than 1 Ω/square, as depicted in FIG. 4(b);
   c. and forming cavities by
      i. depositing, at 1000° C., a thermal oxide of silicon dioxide on the substrate electrode layer 102 as depicted in FIG. 4(c);
      ii. coating said thermal oxide layer with a photoresist 106 as depicted in FIG. 4(d);
      iii. etching said photoresist 104 with UV radiation 112 while preserving the photoresist regions corresponding to the desired cavity wall positions using a mask 110 as depicted in FIG. 4(e);
      iv. forming the cavity walls 114 by reactive ion etching (RIE) 116 of regions of said thermal oxide layer not covered by the photoresist 108, using CHF$_3$ and CF$_4$ as depicted in FIG. 4(f);
      v. and removing the leftover photoresist 108, using O$_2$ plasma, as depicted in FIG. 4(g);
2. preparation of the membrane by
   a. preparing or obtaining of a silicon wafer as a membrane base wafer 118, coated with a diamond layer 120 of UNCD or NCD whose residual stress is lower than 50 MPa, as depicted in FIG. 5(a);
   b. forming a HTO intermediate layer 122 of silicon dioxide on said diamond layer 120, by low pressure chemical vapor deposition at 850° C. using SiH$_2$Cl$_2$ and N$_2$O as depicted in FIG. 5(b);
   c. and adjusting the surface roughness and thickness of said intermediate layer 124, by chemical mechanical polishing such that the surface roughness is in a small vicinity of 0.3 nm, as depicted in FIG. 5(c);
3. assembling the membrane on the substrate, after activation of the respective surfaces with N$_2$ plasma and at 550° C., under a vacuum of 10$^{-4}$ mbar and a force of 10 kN for 7 hours, such that the intermediate layer 124 is facing cavities, by direct wafer bonding between the intermediate layer 124 and the cavity walls 114 as depicted in FIG. 6(a);
4. removing the membrane base wafer 118 by
   a. optionally, decreasing the thickness of the membrane base wafer 118 to 100 µm by grinding, in order to decrease etching time, as depicted in FIG. 6(b);
   b. coating the substrate base wafer 100 with a protective layer of SiO$_2$ 128, by plasma enhanced chemical vapor deposition (PECVD), to provide protection of the substrate base wafer 100 as depicted in FIG. 6(c);
   c. removing the membrane base wafer 126 by etching with tetramethylammonium hydroxide as depicted in FIG. 6(d);
5. and forming the membrane electrode 156 and the substrate electrode connections 158 by
   a. coating the diamond layer 120 with a protective layer of SiO$_2$ 130, by PECVD, to provide protection of the diamond layer 120 as depicted in FIG. 7(a);
   b. coating the last mentioned protective layer 130 with a photoresist 132 as depicted in FIG. 7(b);
   c. etching said photoresist 130 with UV radiation 112 while preserving the photoresist regions 134 corresponding to the desired membrane shape and substrate electrode connection positions 158 using a mask 136 as depicted in FIG. 7(c);
   d. reactive ion etching 116 of regions of the last mentioned protective layer 138 not covered by the photoresist 134 as depicted in FIG. 7(d);
   e. reactive ion etching 140 of diamond 142 not covered by the last mentioned protective layer 138, and removing the leftover photoresist 134 via inductively coupled oxygen plasma as depicted in FIG. 7(e);

f. reactive ion etching 116 of high temperature oxide layer 144, thermal oxide cavity wall 146, and protective layer of $SiO_2$ 130, while diamond 142 acts as etch stop as depicted in FIG. 7(f);

g. forming a metal coating of aluminum 148 at the top of the CMUT by sputtering as depicted in FIG. 8(a);

h. coating said metal coating 148 with a photoresist 150 as depicted in FIG. 8(b);

i. etching said photoresist 150 with UV radiation 112 while preserving the photoresist regions 154 corresponding to the desired membrane electrode 156 shapes and substrate electrode connection 158 positions, using a mask 152 as depicted in FIG. 8(c);

j. wet chemical etching of regions of the metal coating not covered by the photoresist 154 as depicted in FIG. 8(d), and removing the leftover photoresist 154 as depicted in FIG. 8(d).

During the deposition of HTO in step 2.b., $SiH_2Cl_2$ and $N_2O$ are employed. However, the $N_2O$ gas, being a strong oxidizer, can damage the diamond layer 120. Therefore this process is performed with a specific flow rate ratio of $SiH_2Cl_2$ to $N_2O$ equal to 1:2, leaving no excess $N_2O$, whereas the conventional ratio is 1:5.

Removing of a membrane base wafer 118 of 500 μm solely by etching with tetramethylammonium hydroxide takes ten to twelve hours. Therefore the optional step 4.a. is incorporated thus decreasing the etching time to approximately two hours.

In an embodiment of the invention, the membrane electrode 156 consists of a titanium layer on the membrane to provide stiction, a platinum layer on said titanium layer to act as a diffusion barrier and a gold layer on said titanium layer.

The arrays of CMUT cells according to the invention can be of circular, polygonal or any other shape, and be arranged in various patterns by using masks of relevant shapes. Generally, the most efficient CMUT design, in terms of cells per area, would consist of regular hexagonal cells. Such an array with circular cells is depicted in FIG. 3.

Figure 9:
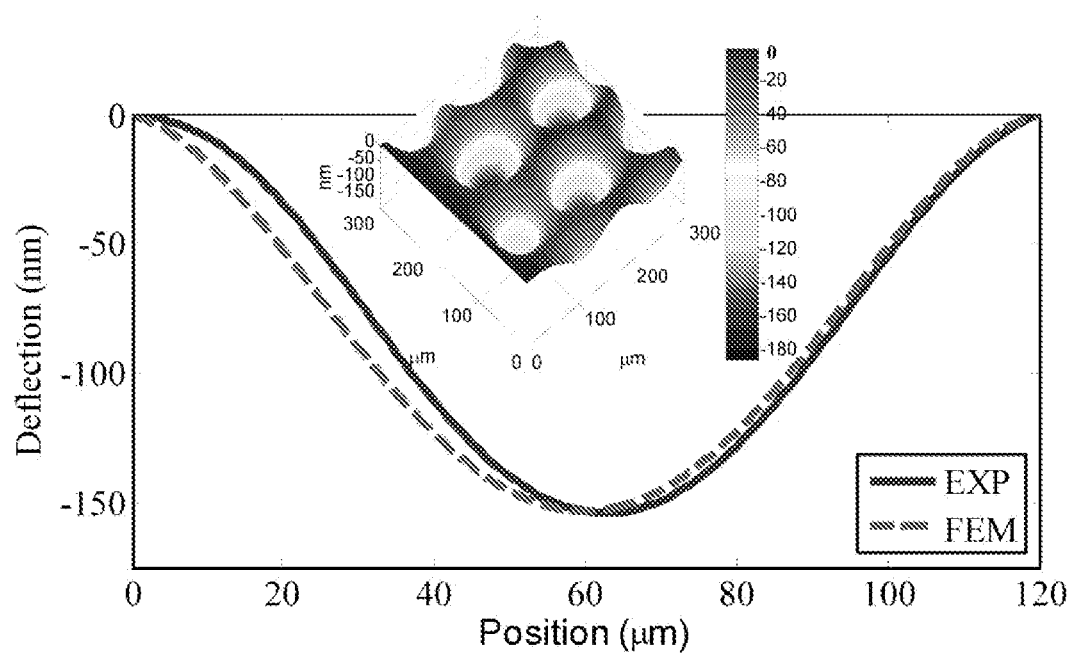
FIG. 9(a) is a graph showing the experimental and the theoretical deflection profiles of a CMUT with a nanocrystalline diamond membrane according to the invention.
FIG. 9(b) is a graph showing the experimental and the theoretical deflection profiles of a CMUT with a ultrananocrystalline diamond membrane according to the invention.
Figure 9:
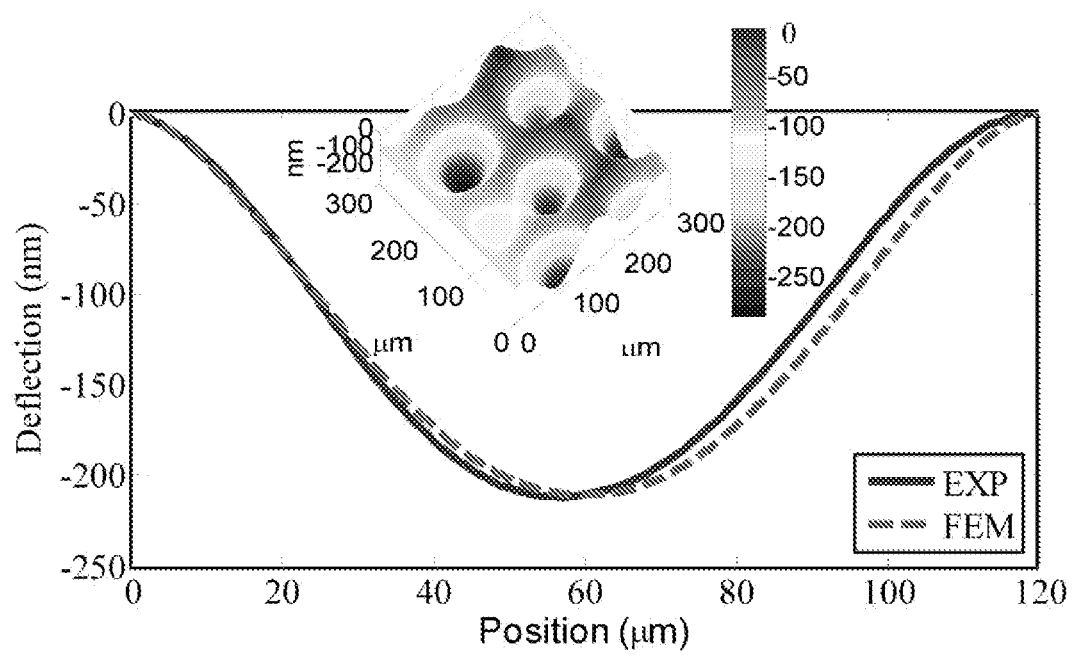

The deflection profiles of two CMUTs fabricated according to the invention with membranes of NCD and UNCD are depicted in FIG. 9(a) and FIG. 9(b), respectively. The solid lines mark the measured values while the dashed ones mark the theoretical values which were obtained using finite element analysis method.

Figure 10:
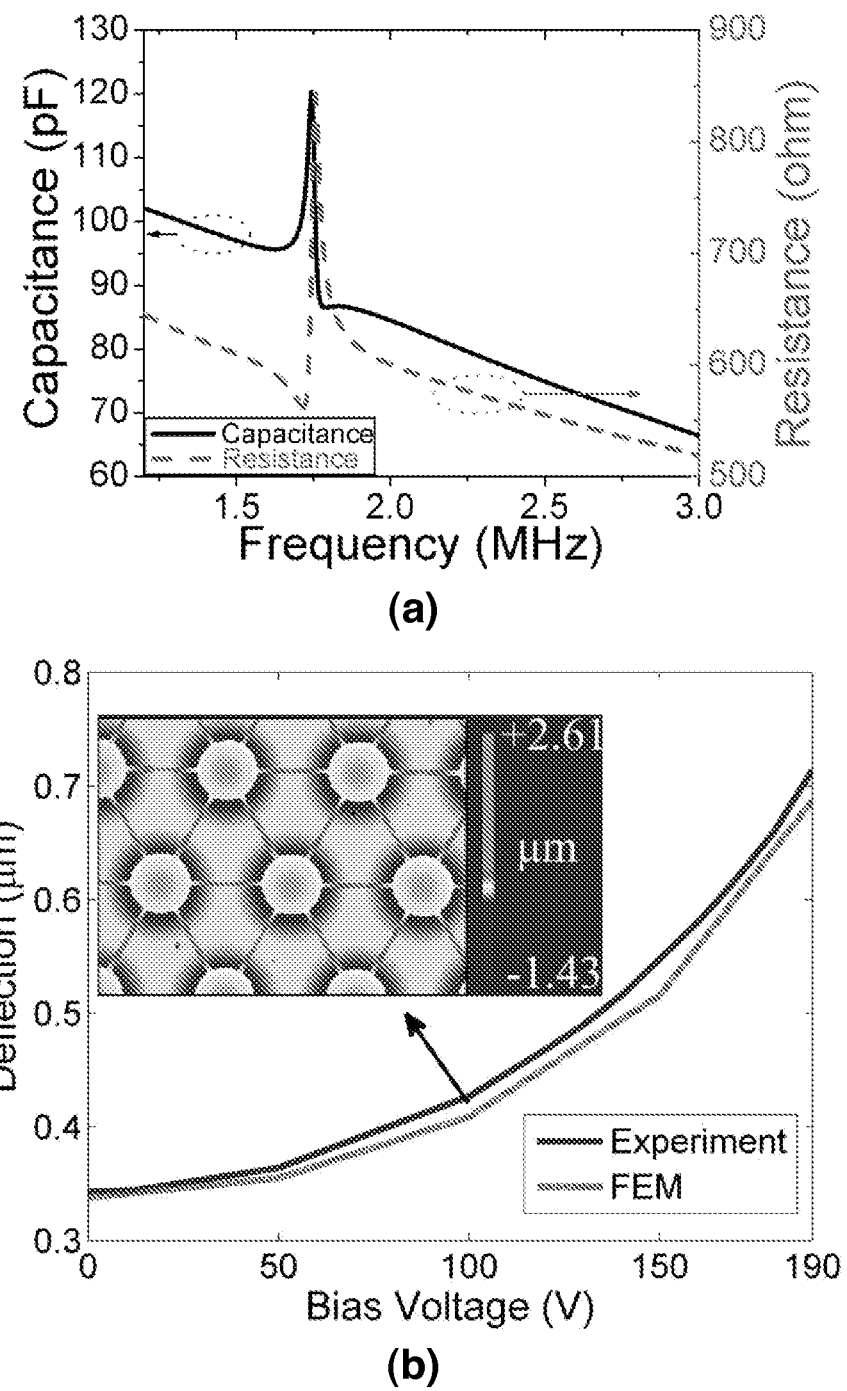
FIG. 10(a) is a graph of capacitance and resistance versus frequency for a CMUT according to the invention.
FIG. 10(b) is a graph showing the experimental and the theoretical deflection profiles versus bias voltage of a CMUT according to the invention.
Figure 11:
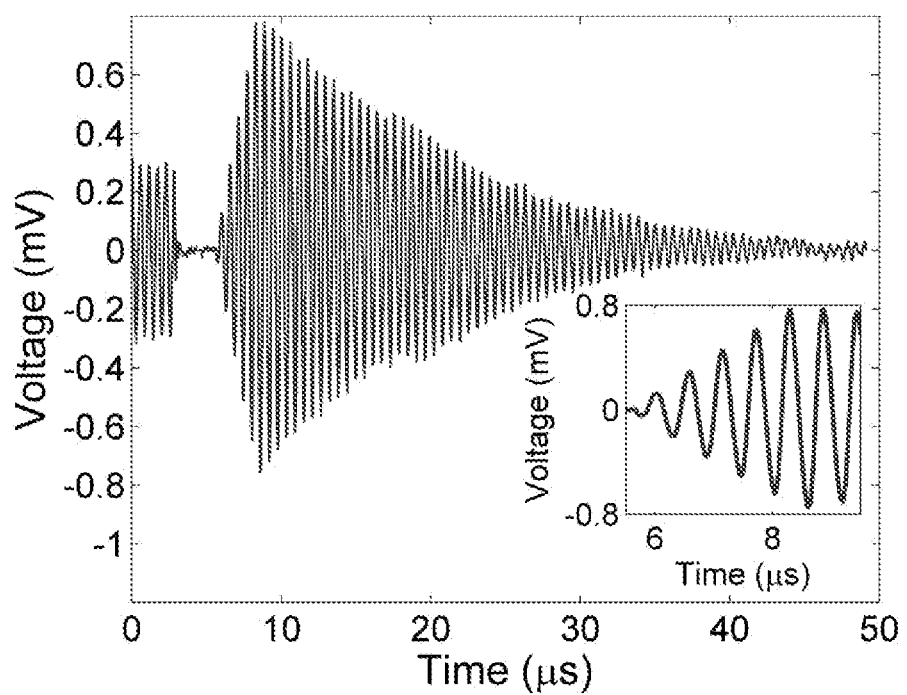
FIG. 11 is a graph of hydrophone readings with respect to time relating to an airborne CMUT according to the invention.

A CMUT having an inner radius of 2586 μm containing 1500 CMUT cells of a circular shape and a diameter of 120 μm was tested in air using a hydrophone. Capacitance and resistance of said CMUT was measured against a range of frequency, and the results are shown in FIG. 10(a). Deflection versus bias voltage was measured using white light interferometer, and the results are depicted in FIG. 10(b). The solid lines mark the measured values while the dotted ones mark the theoretical values which were obtained using finite element analysis method. Moreover, a DC bias voltage of 100 V and a sinusoidal AC voltage of 1.74 MHz with a peak-to-peak voltage 35 V were applied on said CMUT for 5 cycle burst. The hydrophone was aligned with the central normal of the CMUT at a 1.9 mm from the surface of the CMUT. The hydrophone readings are with respect to time are seen in FIG. 11.

Figure 12:
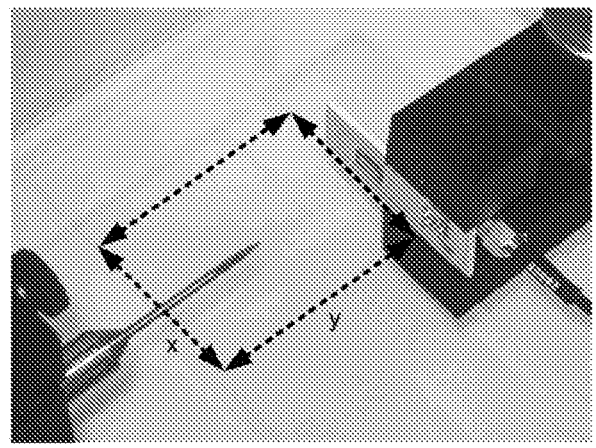
FIG. 12(a) is a photo of aligned diamond-based CMUT and needle hydrophone in immersion. 2-D scan area in x and y coordinates are shown visually. Origin corresponds to the center of the CMUT.
FIG. 12(b) is a graph of measurement results of the normalized peak-to-peak pressure (in dB) for 2-D scan area. Theoretically calculated lines separating the main lobe and the side lobes are also shown with dotted lines on top of the measurement data.
Figure 12:
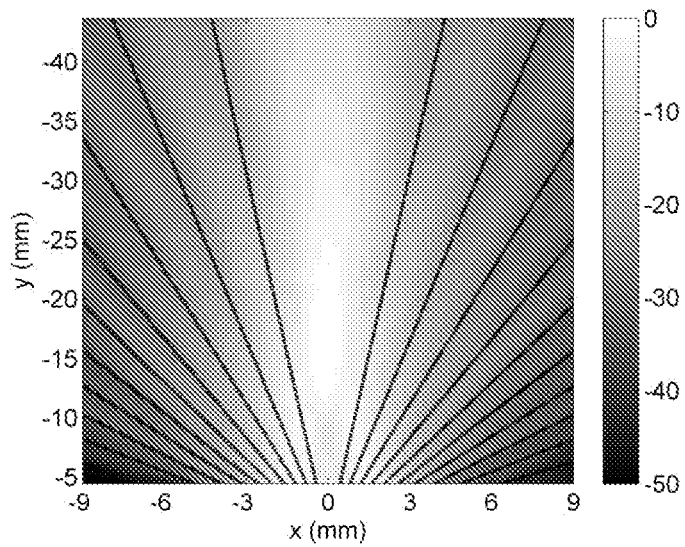
Figure 13:
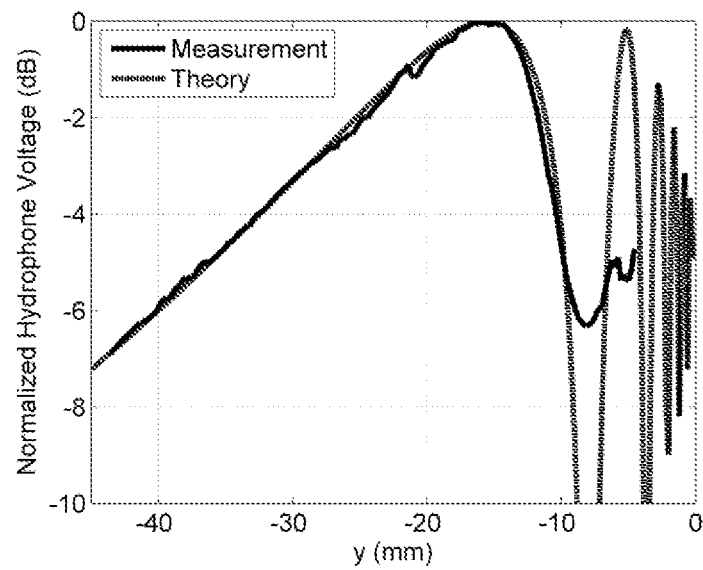
FIG. 13(a) is a graph of experimental and theoretical results of the normalized peak-to-peak pressure on the normal of the CMUT surface.
FIG. 13(b) is a graph of experimental acoustic output pressure along the x-axis parallel to the CMUT surface at y=15 mm (Fresnel distance (S=1)), y=30 mm (S=2), and y=8.2 mm (S=0.5).
FIG. 13(c) is a graph of spectrum of the diamond-based CMUT with peak-to-peak AC amplitudes of 9 V, 36 V, and 54 V.
Figure 13:
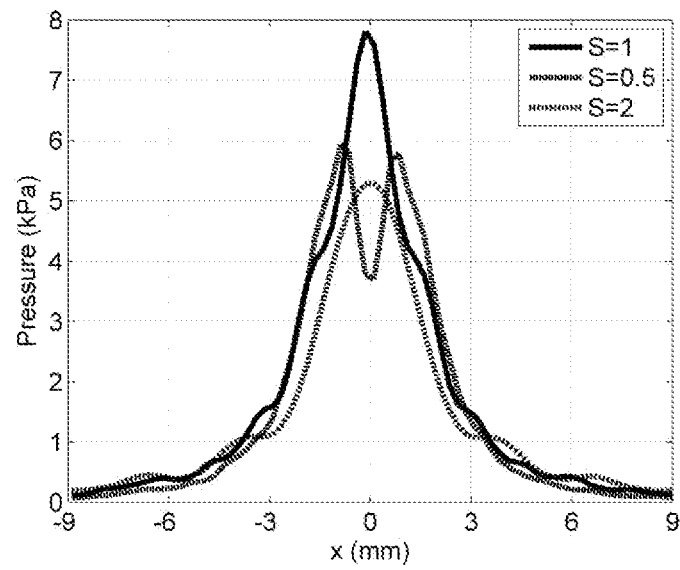
Figure 13:
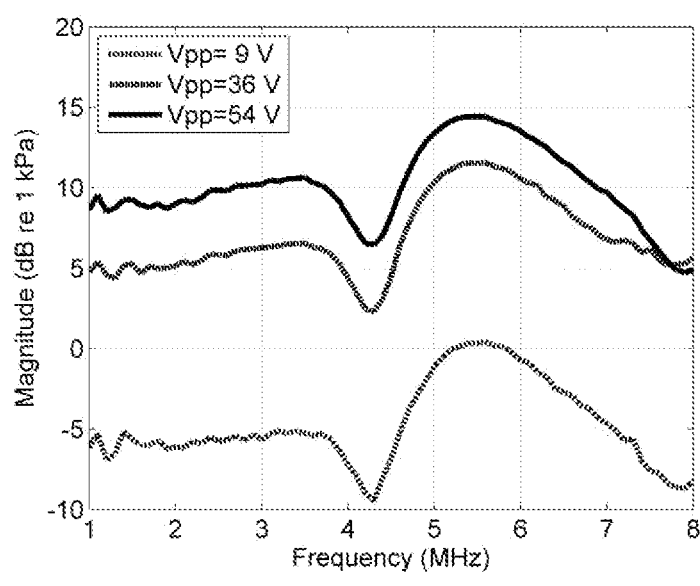

A CMUT having an inner radius of 2586 μm containing 2708 CMUT cells of a circular shape and a diameter of 88 μm was tested in sunflower oil using a hydrophone as depicted in FIG. 12(a). A DC bias voltage of 100 V and a sinusoidal AC voltage of 3.5 MHz with a peak-to-peak voltage of 36 V were applied on said CMUT for 10 periods. A two dimensional ultrasound scan was performed, and the results obtained are shown in FIG. 12(b). Moreover, normalized peak-to-peak pressure along the central normal of said CMUT was measured, and the results are depicted in FIG. 13(a). The solid lines mark the measured values while the dotted ones mark the theoretical values which were obtained using finite element analysis method. Also, using the two dimensional scan data and the calibration values of the hydrophone, the acoustical output pressure of the CMUT along lines parallel to the CMUT was obtained as shown in FIG. 13(b). The data for lines at distances of 15 mm (Fresnel distance, S=1), 30 mm (S=2) and 8.2 mm (S=0.5) are depicted in FIG. 13(b). A symmetrical double peak at S=0.5 and a single peak with reduced magnitude at S=2 were found as expected by theory. The CMUT was further tested with a hydrophone placed along the central normal at a distance of 54.1 mm from the surface of the CMUT. A DC bias voltage of 100 V and sinusoidal AC voltages were applied on said CMUT for 30 periods. There different AC voltages of peak-to-peak 9, 36 and 54 V, each being varied from 1 MHz to 8 MHz with steps 100 kHz, were used. The output magnitude of the CMUT versus frequency graph for said three voltage values obtained is depicted in FIG. 13(c).

Various embodiments and applications employing the principles of the present invention can be implemented. Therefore the scope of the invention is not limited to the examples above but determined by the following claims.

I claim:

1. A method for microfabrication of a capacitive micromachined ultrasonic transducer (CMUT) containing at least one CMUT cell comprising the steps
    preparing a substrate by
        preparing a first electrode layer on a substrate, preferably by doping of the surface of said substrate;
        forming cavity walls on said first electrode by depositing and then etching a cavity wall material;
    preparing a membrane by
        preparing or obtaining of diamond layer coated on a substrate;
        forming and polishing an intermediate layer on the diamond layer;
    assembling the membrane on the substrate such that the intermediate layer is facing cavities, by plasma-activated direct wafer bonding between the intermediate layer and the cavity walls;
    removing the substrate of the diamond layer;
    and forming at least one first electrode connection;
wherein said intermediate layer is of a material with high chemical affinity towards the cavity wall material, the surface roughness of said intermediate layer is decreased by polishing to below 0.5 nm, and the thickness of said intermediate layer after polishing is determined such that the behavior of the membrane is determined by the diamond layer.

2. The method of claim 1, wherein the cavity wall material is a thermal oxide of silicon oxide and the intermediate layer is of a high temperature oxide of silicon dioxide.

3. The method of claim 2, wherein the ratio of the thickness of the polished high temperature oxide to that of the diamond layer is less than 5, preferably equal to 0.25.

4. The method of claim 2, wherein the high temperature oxide is deposited using $SiH_2Cl_2$ and $N_2O$ and the specific flow rate ratio of $SiH_2Cl_2$ to $N_2O$ is equal to 1:2.

5. The method of claim 2, wherein the thickness of the high temperature oxide before polishing is at least 0.3 μm more than that of the polished high temperature oxide.

6. The method of claim 1, wherein the membrane is assembled to the substrate after surface activation with $N_2$ plasma and at 550° C., under a vacuum of $10^{-4}$ mbar.

7. The method of claim 1, wherein the diamond layer is of nanocrystalline diamond.

8. The method of claim 7, wherein the diamond layer is on a substrate of silicon.

9. The method of claim 1, wherein the diamond layer is of ultrananocrystalline diamond.

10. The method of claim 9, wherein the diamond layer is on a substrate of silicon dioxide.

11. The method of any of claims 7 to 10, wherein the diamond layer has a residual stress less than 50 MPa.

12. The method of claim 1, wherein the first electrode connections are formed in at least one recess in the diamond layer.

13. The method of claim 12, wherein the recesses in the diamond layer are obtained by reactive ion etching of the diamond layer while regions of the diamond layer not to be etched are covered with a protective layer of silicon dioxide.

14. The method of claim 1, wherein the diamond layer is undoped and at least one second electrode is also formed on the membrane during the last step.

15. The method of claim 1, wherein the diamond layer is doped.

16. The method of claim 15, wherein at least one second electrode to act as an electrode connection is also formed on the membrane during the last step.

17. The method of any of claim 14 or 16, wherein the second electrode is of a combination of aluminum, platinum, titanium and gold.

18. The method of claim 17, wherein the second electrode is of aluminum sputtered onto the membrane.

19. The method of claim 17, wherein the second electrode consists of a titanium layer on the membrane, a platinum layer on said titanium layer and a gold layer on said titanium layer.

20. A CMUT consisting of at least one CMUT cell; each comprising of a silicon substrate base wafer; a substrate electrode layer produced on one surface of said substrate base wafer by doping said surface; cavity walls on said substrate electrode layer for defining at least one cavity; a diamond layer to provide membrane functions; an intermediate layer deposited on one side of said diamond layer and providing a surface for direct wafer bonding between said cavity walls and said diamond layer; and substrate electrode connections formed on the substrate electrode layer.

21. The CMUT of claim 20, wherein the cavity wall is of a thermal oxide of silicon oxide and the intermediate layer is of a high temperature oxide of silicon dioxide.

22. The CMUT of claim 21, wherein the ratio of the thickness of the intermediate layer to that of the diamond layer is less than 5, preferably equal to 0.25.

23. The method of claim 20, wherein the diamond layer is of nanocrystalline diamond or ultrananocrystalline diamond.

24. The CMUT of claim 20, wherein the substrate electrode connections are in recesses in the diamond layer.

25. The CMUT of claim 20, wherein the diamond layer is undoped and there is at least one membrane electrode on the membrane.

26. The CMUT of claim 20, wherein the diamond layer is doped.

27. The CMUT of claim 26, wherein there is at least one membrane electrode to act as an electrode connection on the membrane.

28. The CMUT of any of claim 25 or 27, wherein the membrane electrode is of a combination of aluminum, platinum, titanium and gold.

29. The CMUT of claim 28, wherein the membrane electrode is of aluminum.

30. The CMUT of claim 28, wherein the membrane electrode consists of a titanium layer on the membrane, a platinum layer on said titanium layer and a gold layer on said titanium layer.

* * * * *